US011412626B2

(12) United States Patent
Johansson et al.

(10) Patent No.: US 11,412,626 B2
(45) Date of Patent: Aug. 9, 2022

(54) SYSTEM FOR ARRANGING ECUS IN A CHASSIS OF A VEHICLE

(71) Applicant: Volvo Truck Corporation, Gothenburg (SE)

(72) Inventors: Robert Johansson, Höviksnäs (SE); Hamid Yhr, Gråbo (SE); Niklas Haraldsson, Lycke (SE)

(73) Assignee: Volvo Truck Corporation, Gothenburg (SE)

( * ) Notice: Subject to any disclaimer, the term of this patent is extended or adjusted under 35 U.S.C. 154(b) by 0 days.

(21) Appl. No.: 17/608,194

(22) PCT Filed: May 10, 2019

(86) PCT No.: PCT/EP2019/062057
§ 371 (c)(1),
(2) Date: Nov. 2, 2021

(87) PCT Pub. No.: WO2020/228928
PCT Pub. Date: Nov. 19, 2020

(65) Prior Publication Data
US 2022/0183165 A1 Jun. 9, 2022

(51) Int. Cl.
*H05K 5/00* (2006.01)
(52) U.S. Cl.
CPC ......... *H05K 5/0065* (2013.01); *H05K 5/0073* (2013.01)
(58) Field of Classification Search
CPC ............................ H05K 5/0065; H05K 5/0073
See application file for complete search history.

(56) References Cited

U.S. PATENT DOCUMENTS 5,251,103 A 10/1993 Haberstroh et al.
9,761,849 B2 * 9/2017 Lim .................. H01M 10/0481
(Continued)

FOREIGN PATENT DOCUMENTS

DE 102004045853 A1 4/2006
DE 102012006787 A1 10/2013
(Continued)

OTHER PUBLICATIONS

International Search Report and Written Opinion for International Patent Application No. PCT/EP2019/062057, dated Jan. 30, 2020, 16 pages.
(Continued)

*Primary Examiner* — Rockshana D Chowdhury
(74) *Attorney, Agent, or Firm* — Withrow & Terranova, PLLC

(57) ABSTRACT

The invention relates to a system for arranging electronic control units (ECUs) in a chassis of a vehicle. The system comprises a set of ECUs arranged on corresponding circuit boards that are arranged in corresponding casing members. Each casing member comprises a frame structure extending circumferentially in a plane substantially parallel to its corresponding layer. Each circuit board extends in a plane substantially parallel to its corresponding layer and is arranged inside the frame structure of the corresponding casing member. First and second end plates are arranged at opposite end portions of the layered structure. The first end plate is adapted to be connected to the chassis of the vehicle, and at least one connection member extends along the layered structure between opposite end portions thereof. The at least one connection member is configured to be connected to the first and second end plates to hold the layered structure together.

18 Claims, 5 Drawing Sheets

(56) References Cited

U.S. PATENT DOCUMENTS

| | | | | |
|---|---|---|---|---|
| 10,424,763 | B2* | 9/2019 | Nishimura | H01M 50/20 |
| 10,665,906 | B2* | 5/2020 | Hsu | G01R 31/385 |
| 10,826,029 | B2* | 11/2020 | Ogawa | H01M 10/0525 |
| 11,211,656 | B2* | 12/2021 | Matecki | B60K 1/04 |
| 11,258,126 | B2* | 2/2022 | Kwon | H01M 10/6563 |
| 2004/0232672 | A1 | 11/2004 | Bandoh et al. | |
| 2006/0216965 | A1* | 9/2006 | Yamanashi | H05K 5/0021 |
| 2012/0037415 | A1 | 2/2012 | Demma | |
| 2015/0289389 | A1 | 10/2015 | Conway et al. | |
| 2016/0309605 | A1 | 10/2016 | Cheng | |
| 2017/0141371 | A1* | 5/2017 | Toshioka | H01G 11/08 |
| 2020/0036067 | A1* | 1/2020 | Mummigatti | B60L 50/64 |
| 2020/0161597 | A1* | 5/2020 | Ruan | H01M 50/26 |
| 2020/0280040 | A1* | 9/2020 | Lee | H01M 50/528 |
| 2021/0234223 | A1* | 7/2021 | Taniuchi | H01M 50/105 |

FOREIGN PATENT DOCUMENTS

| | | |
|---|---|---|
| EP | 0427106 A2 | 5/1991 |
| EP | 2605091 A1 | 6/2013 |
| WO | 08034538 A2 | 3/2008 |

OTHER PUBLICATIONS

International Preliminary Report on Patentability for International Patent Application No. PCT/EP2019/062057, dated Jul. 16, 2020, 18 pages.

* cited by examiner

SYSTEM FOR ARRANGING ECUS IN A CHASSIS OF A VEHICLE

This application is a 35 USC 371 national phase filing of International Application No. PCT/EP2019/062057, filed May 10, 2019, the disclosure of which is incorporated herein by reference in its entirety.

TECHNICAL FIELD

The invention relates to a system for arranging electronic control units (ECUs) in a chassis of a vehicle.

The invention can typically be applied in heavy-duty vehicles, such as trucks, buses and construction equipment. Although the invention will be described with respect to a truck it is not restricted to this particular vehicle.

BACKGROUND

Trucks and other vehicles contain a large number of electronic control units (ECUs) for controlling various components and functions and many of these ECUs are mounted to the chassis. Packaging of ECUs in the chassis is often a challenge because the available space is limited, because there is a variety of sizes and shapes of the ECUs (or rather of the casing members enclosing the circuit board(s) onto which the ECUs are provided) and because different vehicles require different sets of ECUs. Considering the general development within electronics, electric propulsion, etc, it seems also likely that the use of ECUs will increase in the future.

WO2008/034538 discloses a system for arranging ECUs in a locomotive where the ECUs/casing members have the same shape and size and are arranged in a layered structure that extends along a wall. The idea of allowing adaptation of the system by adding or removing one or more ECUs is interesting, but the disclosed system seems not very suitable for arrangement onto a chassis of e.g. a truck, for instance because it is not clear how the system should be mounted to the chassis and because if many ECUs are needed the system would require a rather long section along the chassis. Further, the disclosed system does not seem to be designed to withstand the rough environment of a truck chassis (dirt, water, etc.).

There is thus a need for improvements in the field of arranging ECUs in a vehicle chassis.

SUMMARY

An object of the invention is to provide an improved system for arranging and packaging of electronic control units in a vehicle chassis, in particular a truck chassis. The object is achieved by a system according to claim 1.

The invention concerns a system for arranging electronic control units (ECUs) in a chassis of a vehicle, wherein the system comprises a set of ECUs arranged on corresponding circuit boards that in turn are arranged in corresponding casing members, wherein the casing members are arranged in a plurality of layers so as to form a layered structure having opposite end portions.

In the inventive system each casing member comprises a frame structure extending circumferentially in a plane substantially parallel to its corresponding layer, wherein each circuit board extends in a plane substantially parallel to its corresponding layer and is arranged inside the frame structure of the corresponding casing member, wherein the system further comprises: first and second end plates arranged at the opposite end portions of the layered structure, wherein the first end plate is adapted to be connected directly or indirectly to the chassis of the vehicle, and at least one connection member extending along the layered structure between the opposite end portions thereof, wherein the at least one connection member is configured to be connected to the first and second end plates so as to hold the layered structure together.

An advantageous effect of this system is that it provides for pre-assembly of a layered structure (which can be held together by the end plates and the at least one connection member) with a particular combination of ECUs adapted to a particular vehicle or a particular position in the chassis. This simplifies manufacturing in that the pre-assembled component can be mounted as one piece to the chassis.

Arranging the circuit boards in the same plane as the corresponding layer provides for the use of relatively large circuit boards without having to increase the thickness of the layer (in contrast to WO2008/034538 where the circuit boards seem to be arranged perpendicular to the layer plane) and it also provides for arranging the circuit boards inside a casing frame that protects the circuit board/ECU from dirt etc.

Further advantages are that it provides for a firm connection to e.g. a cross beam in a truck chassis and that it eliminates packaging problems related to conventional truck ECUs having various shapes and dimensions. It also makes it easy to replace all ECUs, by replacing the entire layered structure, or single ECUs, by replacing single layers or casing members.

A further advantage is that it provides for the possibility to establish a dimension standard for outer shape/casing members for ECUs, which further simplifies manufacturing. A standard size can be set for an individual layer, i.e. a standard size (width and depth and preferably also height) for a "full size" casing member forming an entire layer (and a corresponding standard for the size of the circuit board adapted to fit into the standard casing member). A standard can also be set for parts intended to interact with the connection members, such as size and position of holes arranged in the frame structure of the casing member. Moreover, the system provides for setting further (smaller) standard sizes for casing members (and for corresponding circuit boards) that can be placed adjacent to each other in the same layer, such as casing members that occupy half of a layer or one quarter of a layer so that two, three or four standard casing members (each of which being provided with at least one ECU) can constitute one of the layers in the layered structure. Some ECUs require a smaller circuit board area and can therefore be arranged in a smaller casing member.

It should be noted that one circuit board may be provided with more than one ECU and one casing member may be provided with more than one ECU.

The system thus allows an ECU box to be expanded so that the electrical system can be scaled to the requirements of each individual vehicle.

In an embodiment each casing member has an outer shape substantially resembling that of a rectangular hexahedron with opposite main sides directed towards the opposite end portions of the layered structure.

In an embodiment each casing member is generally constituted by the frame structure and is generally open towards the opposite end portions of the layered structure. Such a shape makes it easy install the circuit boards and the casing member can be produced by extrusion since it can have a constant cross section (in the direction perpendicular to the plane of the layer). The frame structure protects the ECU/circuit board circumferentially and the open ends/sides can be protected by the first and second end plates. Openings for cables and connectors may be arranged in the frame structure.

In an embodiment each circuit board has a size and shape in the plane of the layer that substantially resembles that of an inner side of the frame structure of its corresponding casing member. The circuit board thus fits nicely into the frame structure and can more easily be fixed to the inner side of the frame structure (than if much smaller than the frame structure).

In an embodiment each circuit board is directly or indirectly fixed to an inner side of the frame structure of its corresponding casing member.

In an embodiment each casing member comprises at least one through-hole for receiving the at least one connection member. A casing member may be provided with a plurality of through-holes for receiving a plurality of connection members. As an alternative, the connection member(s) may extend along an outside of the layered structure.

The connection member may be a rod provided with a washer or similar at an outer end for pushing connection onto the second (outer) end plate (when inserted through a hole in the second end plate) and provided with threads at an inner end for connection to a screw hole in the first (inner) end plate. Other connection members and connections are of course possible.

In an embodiment a plurality of through-holes of different casing members arranged in different layers are aligned and wherein the connection member extend through said plurality of through holes.

In an embodiment the system comprises at least a first and a second type of casing members, wherein the size of the first type in relation to the second type is such that the first type of casing member occupies an area in the plane of the layer that is substantially two or four times larger than the corresponding area occupied by the second type of casing member.

If the first type is a "full-size" casing member occupying an entire layer, the second type may then be a "half-size" casing member occupying half of the layer (e.g. left or right half) or a "quarter-size" casing member occupying one fourth of the layer (e.g. a lower left quarter/fourth). If the first type is a "half-size" casing member, the second type may then be a "quarter-size" casing member (or a "half-quarter-size", although it may be that such small casing members will not be used in practice). One full layer in the layer structure may thus contain either one "full-size" casing member, two "half-size", one "half-size" and two "quarter-size" or four "quarter-size" casing members, and in all these cases the layers can have the same outer dimensions.

Further, a certain layered structure may be composed of any mix of layers, for instance, at least one layer with a "full-size" casing member and at least one layer with two "half-size" casing members, or only "full-size" layers. Preferably, the thickness/height of the different types of casing members is the same so that all layers will have the same thickness and so that "half-size" and "quarter-size" casing members can be mixed in a layer without problem. "Dummy" casing members, i.e. casing members without ECU (or with a disconnected ECU), may be used to fill up a layer that is not full.

Some ECUs require smaller circuit boards and some require larger. The size of the circuit boards are adapted to the size/type of the corresponding casing member. By providing casing members in different sizes adapted for different types/sizes of ECUs/circuit boards, a standard can be set that includes different sizes.

That the system comprises at least a first and a second type of casing members as defined above means that the system comprises e.g. i) "full", "half" and "quarter" casing members, ii) "full" and "half" casing members, or iii) "full" and "quarter" casing members, or iv) "half" and "quarter" casing members.

"Half-size" and "quarter-size" casing members are preferably mechanically connected to each other so as stabilize a layer composed of more than one casing member. This connection may be established directly between the casing members or via an intermediate connection part placed between the casing members.

In an embodiment a first layer in the layered structure comprises one single casing member.

In an embodiment a second layer in the layered structure comprises at least two casing members arranged at the side of each other in the plane of the layer.

In an embodiment each casing member is provided with at least one electric connector connected to the ECU arranged inside the casing member.

In an embodiment the electric connector is arranged in an opening at a side of the corresponding casing member.

In an embodiment each ECU comprises electronic components configured to receive and send signals and to process and store information. ECUs are well known as such.

In an embodiment the system comprises at least a first and a second connection member extending on different sides of the layered structure between the opposite end portions thereof, wherein both the first and the second connection members are configured to be connected to the first and second end plates.

In an embodiment the system comprises at least four connection members circumferentially distributed around the layered structure and extending along the layered structure between the opposite end portions thereof, wherein the at least four connection members are configured to be connected to the first and second end plates. Besides making the layered structure steady, four connection members make it possible to have four casing members in one layer and still let each casing member connect directly to a connection member.

In an embodiment the casing members are made of aluminium.

The invention also concerns a vehicle comprising a chassis, wherein the system according to above is mounted to the chassis.

In an embodiment the chassis comprises two longitudinal beams extending along opposite sides of the vehicle and at least one cross beam connecting the longitudinal beams, wherein the system is mounted to the cross beam.

The method also concerns a method for arranging electronic control units (ECUs) in a chassis of a vehicle, the method comprising: providing a set of ECUs arranged on corresponding circuit boards that in turn are arranged in corresponding casing members; arranging the casing members in layers so as to form a layered structure having opposite end portions; arranging first and second end plates at the opposite end portions of the layered structure; arranging at least one connection member so as to extend along the layered structure between the opposite end portions thereof; connecting the at least one connection member to the first and second end plates so as to hold the layered structure together; and connecting the first end plate directly or indirectly to the chassis of the vehicle.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
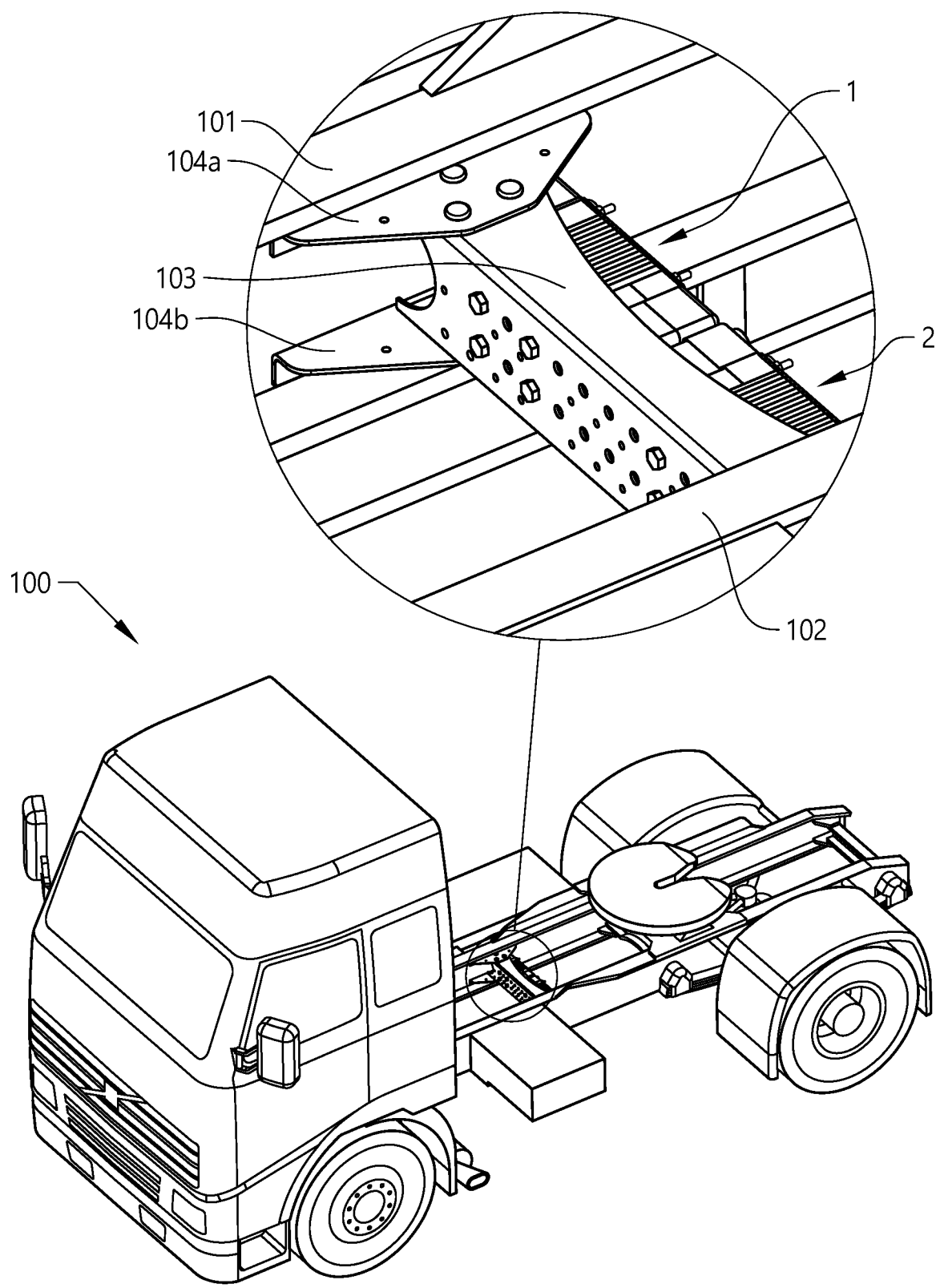
FIG. 1 shows an example of a vehicle where an embodiment (two identical embodiments) of the inventive system for arranging electronic control units (ECUs) is arranged onto a cross beam of a chassis of the vehicle.

FIG. 1 shows a vehicle 100 comprising a chassis, wherein a first and a second (in this example identical) systems 1, 2 for arranging electronic control units (ECUs) are mounted to a cross beam 103 of the chassis the vehicle 100. The chassis comprises two longitudinal beams 101, 102 extending along opposite sides of the vehicle 100 and the cross beam 103 connects the longitudinal beams 101, 102. Connecting brackets 104a, 104b, 104c, 104d are used for connecting the beams (see also FIGS. 2-3).

Figure 7:
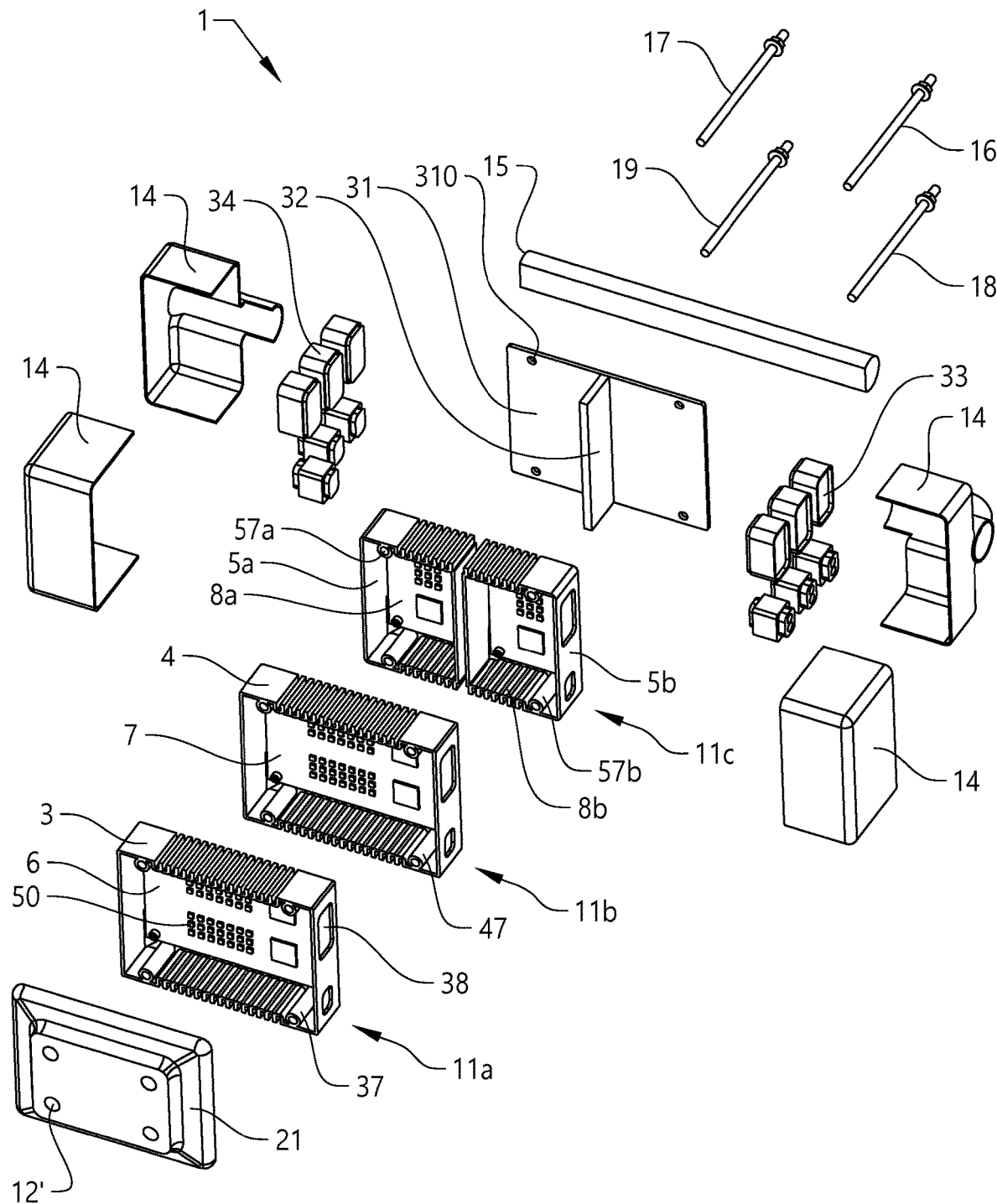
FIG. 7 shows an exploded view of the embodiment of FIG. 5.

As shown in FIGS. 1-7, and in particular in the exploded view of FIG. 7, the system 1, 2 for arranging electronic control units (ECUs) in the chassis of a vehicle 100 comprises a set of ECUs arranged on corresponding circuit boards 6, 7, 8a, 8b that in turn are arranged in corresponding casing members 3, 4, 5a, 5b. The ECU of one of the circuit boards 6 is indicated in FIG. 7 with reference number 50. The casing members 3, 4, 5a, 5b are arranged in a plurality of layers 11a, 11b, 11c so as to form a layered structure having opposite end portions (see also FIG. 5). Layer 11c comprises two casing members 5a, 5b (each with corresponding circuit board and ECU), whereas the other layers 11a, 11b comprises only one casing member 3, 4 each (and each with corresponding circuit board and ECU).

As shown in FIG. 7, each casing member 3, 4, 5a, 5b comprises a frame structure extending circumferentially in a plane substantially parallel to its corresponding layer 11a, 11b, 11c. Further, each circuit board 6, 7, 8a, 8b extends in a plane substantially parallel to its corresponding layer 11a, 11b, 11c and is arranged inside the frame structure of the corresponding casing member 3, 4, 5a, 5b.

Cooling fins (corrugations) are indicated in the casing member frame structures.

Figure 2:
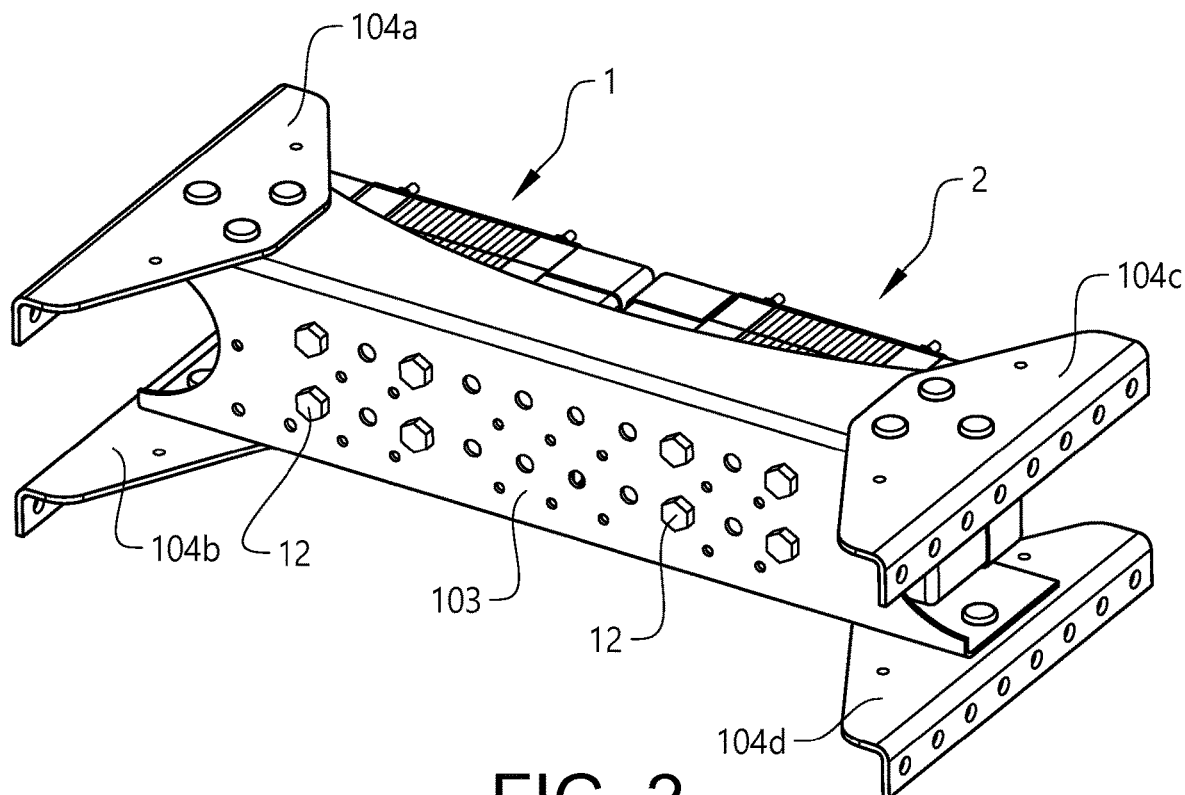
FIG. 2 shows a front side of the cross beam of FIG. 1.
Figure 3:
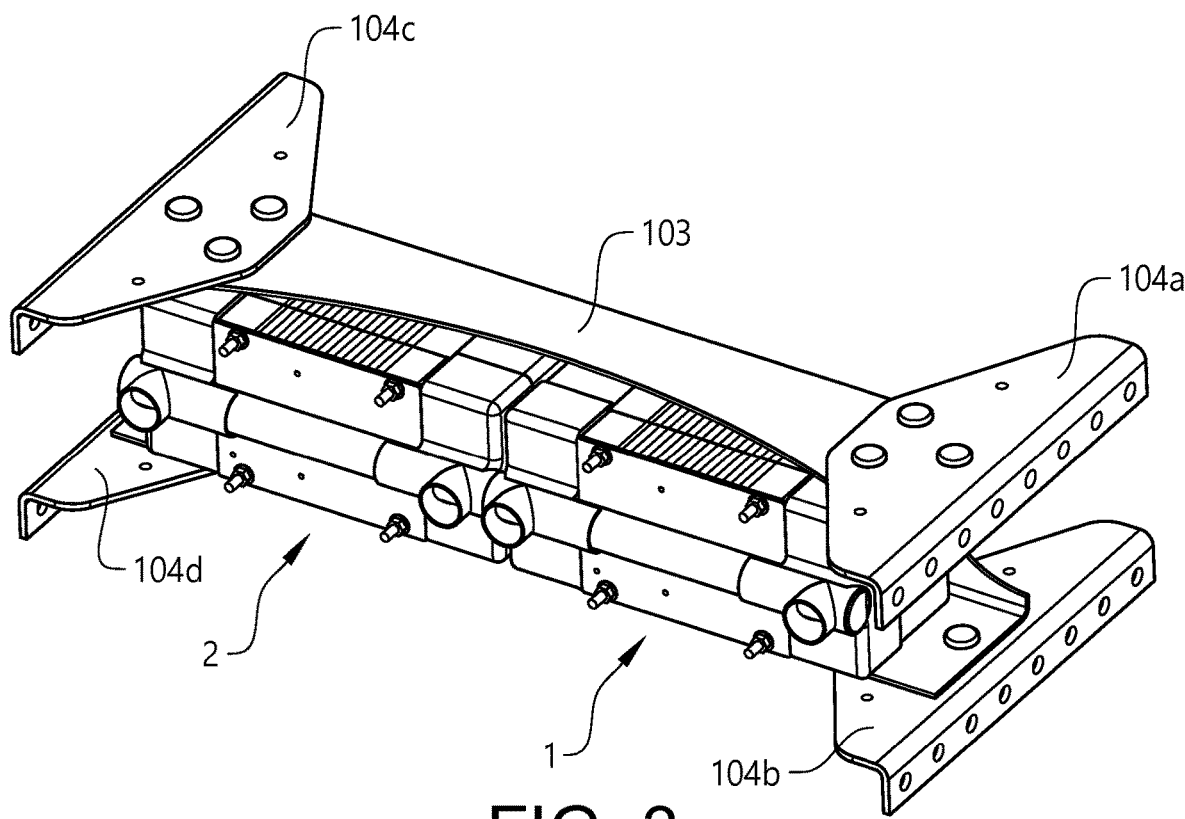
FIG. 3 shows a rear side of the cross beam of FIG. 1.
Figure 4:
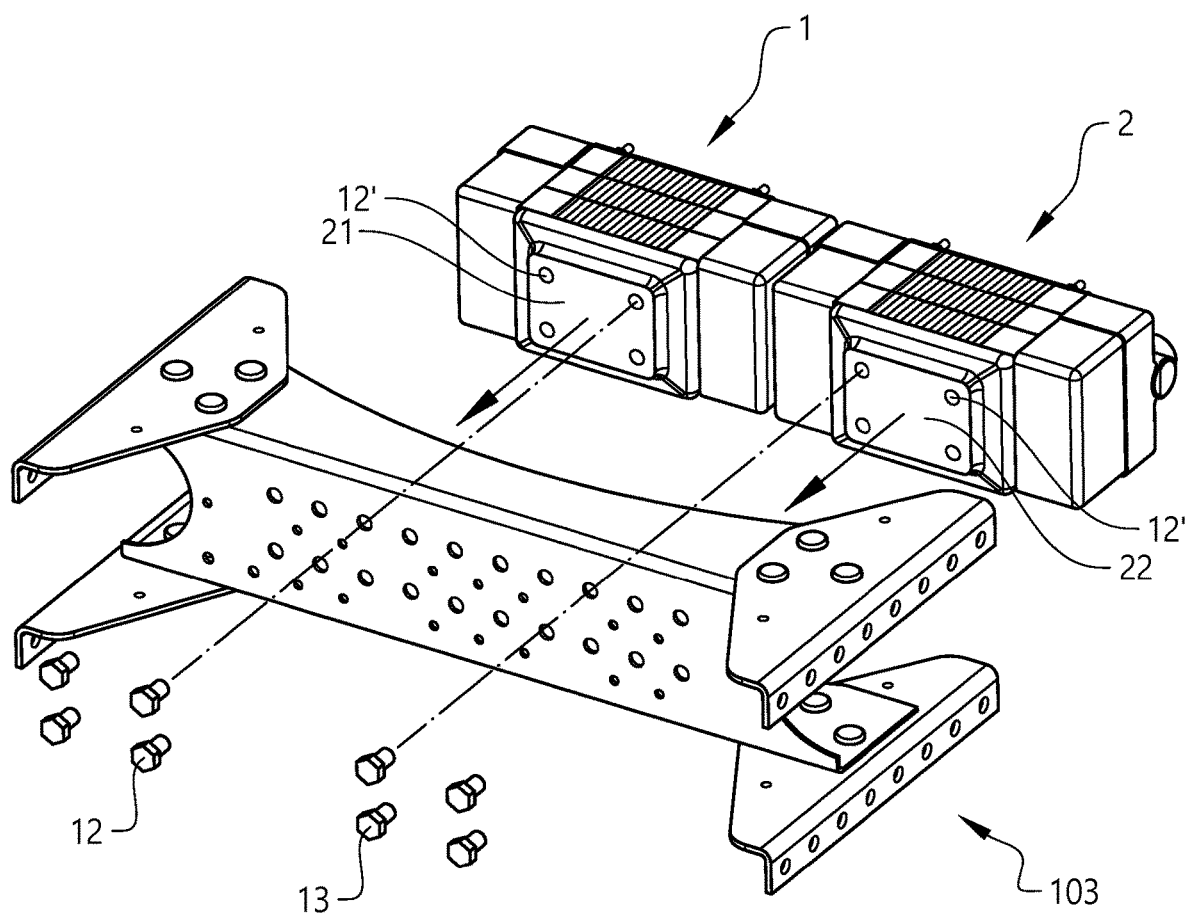
FIG. 4 shows the two identical versions of the embodiment according to FIG. 1 in a preassembled state before mounting to the cross beam.
Figure 5:
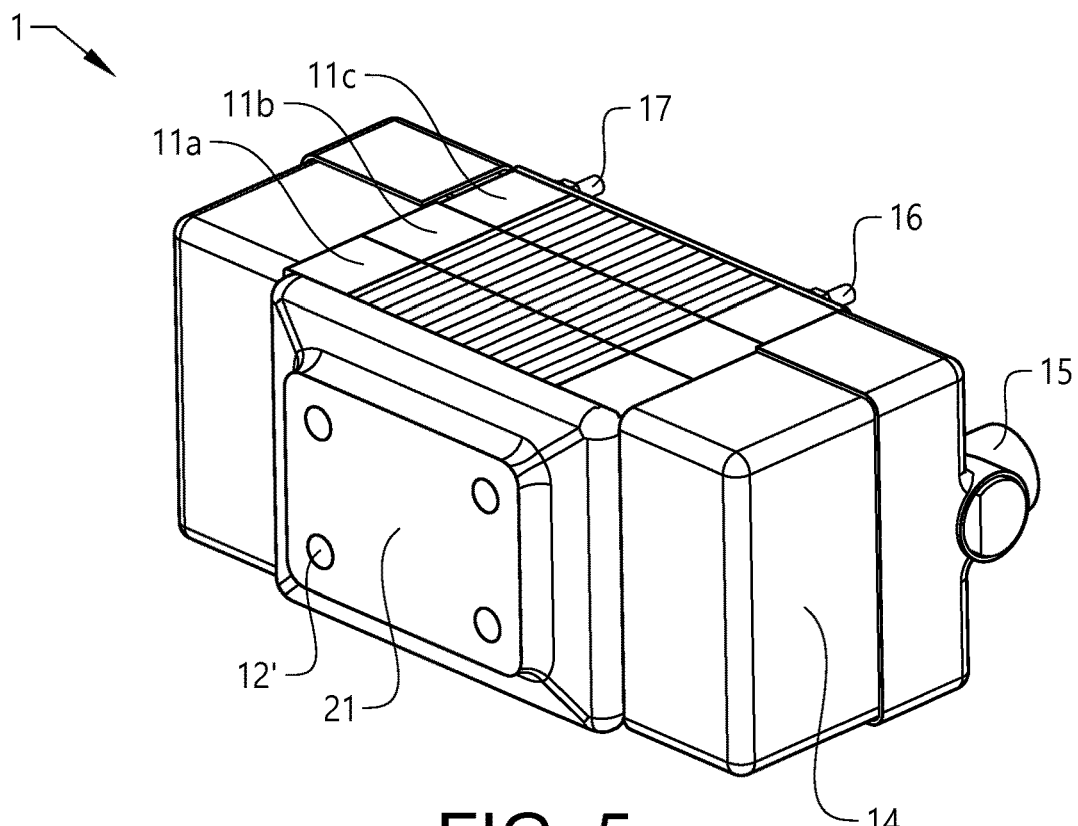
FIG. 5 shows a perspective view of one of the preassembled embodiments according to FIG. 4.
Figure 6:
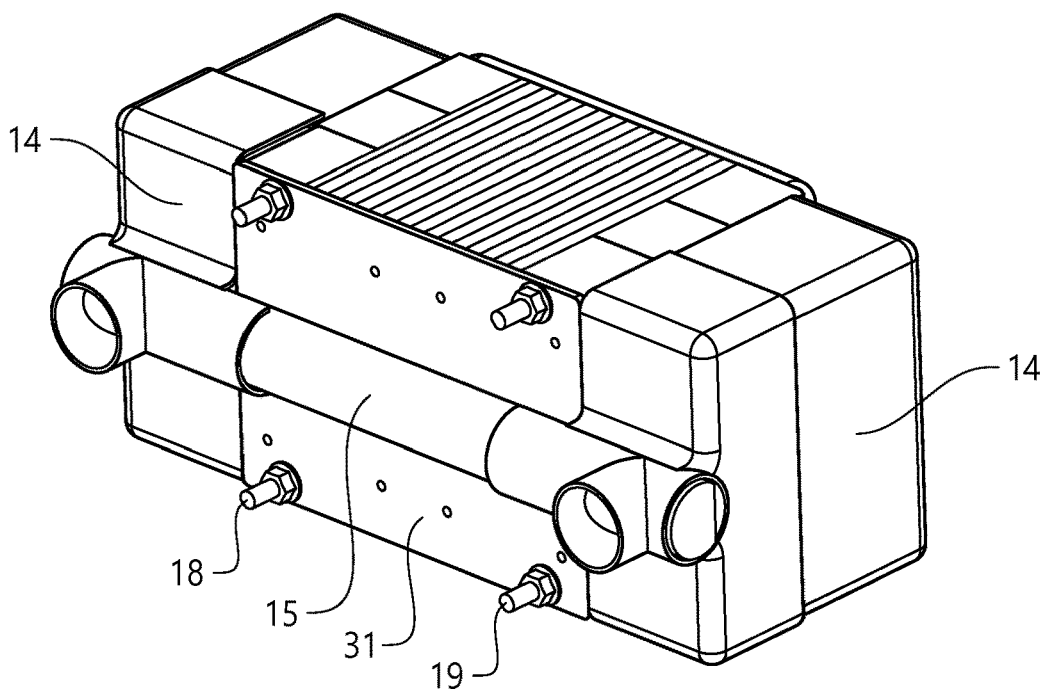
FIG. 6 shows the preassembled embodiment of FIG. 5 in an opposite perspective view.

The system 1, 2 further comprises first and second end plates 21, 22, 31 (see plates 21 and 31 for the first system 1 in FIGS. 5-7) arranged at the opposite end portions of the layered structure, wherein the first end plate 21, 22 is adapted to be connected to the chassis (cross beam 103) of the vehicle by means of bolts 12 and screw holes 12' in the first end plate 21, 22 (see FIGS. 2 and 4).

The system 1, 2 further comprises in this example four connection members 16, 17, 18, 19 extending along the layered structure between the opposite end portions thereof. Each connection member 16, 17, 18, 19 is configured to be connected to the first and second end plates 21, 31 so as to hold the layered structure together (a washer or flange at the outer end of the connection member presses onto the second end plate 31 and an inner end of the connection member is provided with threads connected to screw holes (not shown) arranged in the first end plate 21 on the side facing the layered structure).

Each casing member 3, 4, 5a, 5b has an outer shape substantially resembling that of a rectangular hexahedron with opposite main sides directed towards the opposite end portions of the layered structure. As can be seen in FIG. 7, each casing member 3, 4, 5a, 5b is generally constituted by the frame structure and is generally open towards the opposite end portions of the layered structure. Further, each circuit board 6, 7, 8a, 8b has a size and shape in the plane of the layer 11a, 11b, 11c that substantially resembles that of an inner side of the frame structure of its corresponding casing member 3, 4, 5a, 5b. Each circuit board 6, 7, 8a, 8b is directly or indirectly fixed to an inner side of the frame structure of its corresponding casing member 3, 4, 5a, 5b.

Each casing member 3, 4, 5a, 5b comprises in this case at least two through-holes 37, 47, 57a, 57b for receiving the connection members 16, 17, 18, 19. The through-holes 37, 47, 57a, 57b of the different casing members 3, 4, 5a, 5b arranged in the different layers 11a, 11b, 11c are aligned and the connection members 16, 17, 18, 19 extend through the different sets of aligned through holes 37, 47, 57a, 57b.

Through-holes 310 are also arranged in the second (outer) end plate 31 (see FIG. 7).

Each system 1, 2, and thus each layered structure, comprises in this case a first 3, 4 and a second 5a, 5b type of casing members, wherein the size of the first type in relation to the second type is such that the first type of casing member 3, 4 occupies an area in the plane of the layer 11a, 11b that is substantially two times larger than the corresponding area occupied by the second type of casing member 5a, 5b. More precisely, each of layers 11a and 11b comprises only one casing member 3, 4 that occupies the entire layer, whereas the remaining layer 11c comprises two casing members 5a, 5b, each of which occupying only approximately half of the layer area.

The larger casing members 3, 4 in layers 11a and 11b may be denoted "full-size" casing members and the smaller casing members 5a, 5b in layer 11c may be denoted "half-size" casing members. An intermediate connection part 32 is arranged between the "half-size" casing members 5a, 5b to provide a mechanical connection (not shown) within the layer and thereby stabilize the layer 11c.

Each "full-size" casing member 3, 4 is provided with four through-holes 37, 47 for the corresponding number of connection members 16, 17, 18, 19, whereas each "half-size" casing member 5a, 5b is provided with two through-holes 57a, 57b.

One or more layers may contain two or four "quarter-size" casing members that have a size substantially half of that of the "half-size" casing members 5a, 5b. In such a case further intermediate connection parts may be used to stabilize the layer (unless the casing members are connected directly to each other). Such a "quarter-size" casing member would be provided with one through-hole for receiving one connection member 16, 17, 18, 19.

Each casing member 3, 4, 5a, 5b is provided with at least one electric connector 33 connected to the ECU (50) arranged inside the casing member 3, 4, 5a, 5b. The electric connectors 33 are arranged at openings 38 at a side of the corresponding casing member. Plastic covers 33 are provided to protect the connectors 33. A plastic pipe 15 is provided for protection of electric cables.

Each ECU 50 comprises electronic components configured to receive and send signals and to process and store information.

An example of a method for arranging electronic control units (ECUs) in the chassis of the vehicle 100 comprises the steps of:
- providing a set of ECUs 50 arranged on corresponding circuit boards 6, 7, 8a, 8b that in turn are arranged in corresponding casing members 3, 4, 5a, 5b;
- arranging the casing members 3, 4, 5a, 5b in layers 11a, 11b, 11c so as to form the layered structure having opposite end portions;
- arranging the first and second end plates 21, 31 at the opposite end portions of the layered structure,
- arranging the connection members 16, 17, 18, 19 through the through-holes 37, 47, 57a, 57b so as to extend along and through the layered structure between the opposite end portions thereof,
- connecting the connection members 16, 17, 18, 19 to the first and second end plates 21, 31 by screwing into screw holes in the first end plate 21 and thereby press the second end plate 31 towards the layered structure so as to hold the layered structure together, and
- connecting the first end plate 21, 22 to the chassis of the vehicle 100 by means of bolts 12 and screw holes 12'.

The last step is not needed for preassembling of the system.

It is to be understood that the present invention is not limited to the embodiments described above and illustrated in the drawings; rather, the skilled person will recognize that many changes and modifications may be made within the scope of the appended claims.

The invention claimed is:

1. A system for arranging electronic control units (ECUs) in a chassis of a vehicle, comprising:
a set of ECUs arranged on corresponding circuit boards that in turn are arranged in corresponding casing members, the casing members arranged in a plurality of layers so as to form a layered structure having opposite end portions,
first and second end plates arranged at the opposite end portions of the layered structure, the first end plate adapted to be connected directly or indirectly to the chassis of a vehicle, and
at least one connection member extending along the layered structure between the opposite end portions thereof, the at least one connection member configured to be connected to the first and second end plates to hold the layered structure together,
wherein each casing member comprises a frame structure extending circumferentially in a plane substantially parallel to its corresponding layer of the plurality of layers,
wherein each circuit board extends in a plane substantially parallel to its corresponding layer of the plurality of layers and is arranged inside the frame structure of the corresponding casing member,
wherein each casing member is constituted by the frame structure and is open towards the opposite end portions of the layered structure.

2. The system of claim 1, wherein each casing member has an outer shape substantially resembling that of a rectangular hexahedron with opposite main sides directed towards the opposite end portions of the layered structure.

3. The system of claim 1, wherein each circuit board has a size and shape in the plane of the layer that substantially resembles that of an inner side of the frame structure of its corresponding casing member of the casing members.

4. The system of claim 1, wherein each circuit board is directly or indirectly fixed to an inner side of the frame structure of its corresponding casing member of the casing members.

5. The system of claim 1, wherein each casing member comprises at least one through-hole for receiving the at least one connection member.

6. The system of claim 1, wherein a plurality of through-holes of different casing members arranged in different layers are aligned and wherein the connection member extends through the plurality of through-holes.

7. The system of claim 1, wherein the system comprises at least a first and a second type of casing members, wherein the size of the first type in relation to the second type is such that the first type of casing member occupies an area in the plane of the layer that is substantially two or four times larger than the corresponding area occupied by the second type of casing member.

8. The system of claim 1, wherein a first layer in the layered structure comprises one single casing member.

9. The system of claim 1, wherein a second layer in the layered structure comprises at least two casing members arranged at the side of each other in the plane of the layer.

10. The system of claim 1, wherein each casing member is provided with at least one electric connector connected to the ECU arranged inside the casing member.

11. The system of claim 10, wherein the electric connector is arranged in an opening at a side of the corresponding casing member.

12. The system of claim 1, wherein each ECU comprises electronic components configured to receive and send signals and to process and store information.

13. The system of claim 1, wherein the system comprises at least a first and a second connection member extending on different sides of the layered structure between the opposite end portions thereof, wherein both the first and the second connection members are configured to be connected to the first and second end plates.

14. The system of claim 1, wherein the system comprises at least four connection members circumferentially distributed around the layered structure and extending along the layered structure between the opposite end portions thereof, wherein the at least four connection members are configured to be connected to the first and second end plates.

15. The system of claim 1, wherein the casing members are made of aluminium.

16. A vehicle comprising:
a chassis, and
a system mounted to the chassis, the system configured to arrange electronic control units (ECUs) in the chassis of a vehicle, the system comprising:
a set of ECUs arranged on corresponding circuit boards that in turn are arranged in corresponding casing members, the casing members arranged in a plurality of layers so as to form a layered structure having opposite end portions, first and second end plates arranged at the opposite end portions of the layered structure, the first end plate adapted to be connected directly or indirectly to the chassis of a vehicle, and at least one connection member extending along the layered structure between the opposite end portions thereof, the at least one connection member configured to be connected to the first and second end plates to hold the layered structure together, wherein each casing member comprises a frame structure extending circumferentially in a plane substantially parallel to its corresponding layer of the plurality of layers, wherein each circuit board extends in a plane substantially parallel to its corresponding layer of the plurality of layers and is arranged inside the frame structure of the corresponding casing member, wherein each casing member is constituted by the frame structure and is open towards the opposite end portions of the layered structure.

17. The vehicle of claim 16, wherein the chassis comprises two longitudinal beams extending along opposite sides of the vehicle and at least one cross beam connecting the longitudinal beams, wherein the system is mounted to the cross beam.

18. A method for arranging electronic control units (ECUs) in a chassis of a vehicle, comprising:

providing a set of ECUs arranged on corresponding circuit boards that in turn are arranged in corresponding casing members, the casing members arranged in a plurality of layers so as to form a layered structure having opposite end portions, arranging the casing members in layers so as to form a layered structure having opposite end portions, wherein each casing member comprises a frame structure extending circumferentially in a plane substantially parallel to its corresponding layer of the plurality of layers and open towards the opposite end portions of the layered structure, and wherein each circuit board extends in a plane substantially parallel to its corresponding layer of the plurality of layers and is arranged inside the frame structure of the corresponding casing member of the casing members, arranging first and second end plates at the opposite end portions of the layered structure, wherein the first end plate is connected directly or indirectly to the chassis of a vehicle arranging at least one connection member so as to extend along the layered structure between the opposite end portions thereof, the at least one connection member configured connected to the first and second end plates to hold the layered structure together connecting the at least one connection member to the first and second end plates so as to hold the layered structure together, and connecting the first end plate directly or indirectly to the chassis of the vehicle.

* * * * *